(12) United States Patent
Crowley et al.

(10) Patent No.: US 8,406,702 B2
(45) Date of Patent: Mar. 26, 2013

(54) CLOCK SIGNAL GENERATING ARRANGEMENT FOR A COMMUNICATION DEVICE

(75) Inventors: Michael Crowley, Blarney (IE); Norman Beamish, Cork (IE); Sean Sexton, Cork (IE); Kenneth Stebbings, Grayslake, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 158 days.

(21) Appl. No.: 12/920,607

(22) PCT Filed: Mar. 26, 2008

(86) PCT No.: PCT/IB2008/051122
§ 371 (c)(1),
(2), (4) Date: Sep. 2, 2010

(87) PCT Pub. No.: WO2009/118588
PCT Pub. Date: Oct. 1, 2009

(65) Prior Publication Data
US 2011/0012663 A1  Jan. 20, 2011

(51) Int. Cl.
*H04B 1/40* (2006.01)

(52) U.S. Cl. ............ 455/76; 455/17; 455/23; 455/63.1; 455/63.3; 455/67.13; 455/71; 455/75; 455/553.1; 455/139; 455/136; 455/147; 455/164.1; 455/165.1; 455/182.1; 455/131; 455/160.1; 455/155; 455/260; 455/265; 375/145

(58) Field of Classification Search .................. 455/76
See application file for complete search history.

(56) References Cited

U.S. PATENT DOCUMENTS

| | | | |
|---|---|---|---|
| 6,154,642 A * | 11/2000 | Dumont et al. | 455/403 |
| 6,876,874 B2 * | 4/2005 | Arnaud et al. | 455/574 |
| 7,551,911 B2 * | 6/2009 | Shohara et al. | 455/343.1 |
| 2002/0010010 A1 | 1/2002 | Arnaud et al. | |
| 2009/0081961 A1 * | 3/2009 | Rofougaran | 455/76 |

FOREIGN PATENT DOCUMENTS

| | | |
|---|---|---|
| WO | 2005/114852 A | 12/2005 |
| WO | 2007/000712 A | 1/2007 |

OTHER PUBLICATIONS

Robert Bogdan Stazewski and Poras T. Balsara, All-Digital Frequency Synthesizer in Deep-Submicron CMOS, John Wiley & Sons, Inc. 2006, Chapter 1.*
Freescale Semiconductor Inc: "DSP56600 16-bit Digital Signal Processor Family Manual" Motorola, Incorporated, Semiconductor Products Sector, DSP Division, Austin, TX, pp. 1-546.
International Search Report and Written Opinion correlating to PCT/IB2008/051122 dated Dec. 4, 2008.

* cited by examiner

*Primary Examiner* — Fayyaz Alam
*Assistant Examiner* — Mohammed Rachedine (57) ABSTRACT

A clock signal generating arrangement for a communication device generates a system clock signal at an output for use as a timing reference. The clock signal generating arrangement comprises a reference clock generator for generating a reference clock signal, a main clock generator for generating a main clock signal having a greater accuracy than the reference clock signal, a clock adjust circuit coupled to the reference clock generator for generating a compensated reference clock signal to compensate for error in the reference clock signal and a clock signal selector coupled to the reference clock generator the main clock generator and the clock adjust circuit. The clock signal selector selectively provides to the output of the clock signal generating arrangement as the system clock signal the compensated reference clock signal when an error in the reference clock signal reaches a first predetermined threshold and until the error in the reference clock signal has been compensated and otherwise the reference clock signal when the communication device is operating in an idle mode or the main clock signal when the communication device is operating in an active mode.

20 Claims, 4 Drawing Sheets

CLOCK SIGNAL GENERATING ARRANGEMENT FOR A COMMUNICATION DEVICE

FIELD OF THE DISCLOSURE

This disclosure relates to a clock signal generating arrangement for a communication device, to a transceiver block, to a wireless communication system and to a method for generating a clock signal.

BACKGROUND

Wireless communication systems, for example cellular or private mobile radio (PMR) communication systems, typically provide for radio communication links to be arranged between a wireless communication network comprising a plurality of base stations (BSs) and a plurality of communication devices, often termed mobile stations (MSs). The MS may be a portable or mobile telephone, a Personal Digital Assistant (PDA), a wireless video or multimedia device, a portable computer, or the like.

A MS typically comprises a RF transceiver block for providing the RF transmit and receive paths of the MS, a baseband block for processing baseband signals received from the RF transceiver block or to be transmitted by the RF transceiver block, and a processing unit for controlling the operation of the MS. The MS further includes a timer, typically known as a layer one timer, which controls the timing and synchronisation of the events and processes in the MS. For example, the layer one timer can assist in synchronising the MS with a BS to ensure that events are processed in a timely manner relative to the radio-air interface. The layer one timer is controlled by a baseband processor which may be part of or separate to the processing unit or may be part of the baseband block. In modern MS devices, typically the RF transceiver block provides an accurate system clock signal which is used as a timing reference for the baseband block, for example as a timing reference for the layer 1 timer. This means that the timing of all events in the MS will be controlled by the system clock signal provided by the RF transceiver block. It is therefore not acceptable to allow this clock reference to accumulate significant error over time. The acceptable level of error is determined by system requirements.

Currently, the most ubiquitous 2nd generation cellular communication system is the Global System for Mobile communication (GSM). In order to enable data to be transferred at much higher data rates than the rates available under GSM, a number of enhancements and additions have been introduced to the GSM communication system. One such enhancement being the General Packet Radio System (GPRS) which uses packet switched data rather than circuit switched data and so makes much more efficient use of the available capacity. Another such enhancement to the GSM communication system is the Enhanced Data rates for GSM Evolution system, which is more commonly known as the EDGE system, a 2.5G system. 3rd generation (3G) systems, such as the Universal Mobile Telecommunication System (UMTS) have been developed and deployed to further enhance the communication services provided to MSs compared to those communication services provided by GSM.

Multi-mode MSs have been developed which are capable of operating in more than one communication system. A WEDGE (WCDMA and EDGE) capable MS, for example, is a dual mode MS which, can operate in a 2G and a 3G system. In a WEDGE dual mode MS, due to the high data rates employed by the 3G protocol, it is increasingly common that the RF transceiver block of the MS employs a 3G DigRF interface standard or similar protocol supporting high data rates to govern its communication with the baseband block. The 3G DigRF standard specifies a 312 Mbps data rate between the RF transceiver block and the baseband block and thus, one consequence of using a 3G DigRF interface is that the RF receiver block requires a high speed Phase Lock Loop (PLL) (for example a 1248 MHz PLL) in order to generate the 312 MHz data clock. The system clock which is used as the timing reference for the baseband block as discussed above may also be derived from this high speed PLL circuit. Observation of the signal received at the RF transceiver block from a BS is used to calibrate the local frequency reference in the PLL circuit through manipulation of the PLL circuit (e.g. by adding a correction to the divider in the PLL circuit) so as to generate a corrected system clock. This ensures that the level of error in the system clock is kept to an acceptable error by means of the PLL circuit. Other techniques are known to correct the errors in the system clock, for example, the tuning voltage to a voltage controlled crystal oscillator (VCXO) can be changed via a Digital-to-Analog Converter (DAC) in order to correct for frequency errors. However, such analog techniques, such as the VCXO and DAC solution, provide less flexibility than a PLL circuit.

However, as the speed of a PLL circuit increases, the current and hence power consumption of the PLL circuit increases. Since in 2G systems, the data transfer rates are normally much lower than in 2.5G and 3G systems, single mode 2G MSs do not need a high speed PLL circuit for the interface between the RF transceiver block and the baseband block. Hence less power is required to generate the system clock in a single mode 2G MS compared to a 3G DigRF enabled dual mode WEDGE MS. Typically, current drain savings of the order to 1-2 mA can be expected in 2G systems compared to 3G systems. Furthermore, in a single mode 2G MS when there are no transmit or receive signals, the MS can enter an idle mode in which the RF transceiver can be almost completely shut down. In such an idle mode with the RF transceiver almost completely shut down, low current is required and hence power consumption is low. However, this is not possible with the current designs of a dual mode WEDGE MS since the high speed PLL must be continually active to ensure accuracy of the system clock by providing a corrected system clock to the baseband block.

SUMMARY

The present invention provides a clock signal generating arrangement for a communication device, a transceiver block, a wireless communication system and a method for generating a clock signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the drawings.

DETAILED DESCRIPTION OF THE DRAWINGS

The present disclosure will be described with reference to a wireless communication device, hereinafter referred to as a Mobile Station (MS), but it will be appreciated that the present disclosure may apply to any communication device, such as a portable or mobile telephone, a Personal Digital Assistant (PDA), a wireless video or multimedia device, a portable computer, or the like. It will be appreciated however that the present disclosure provides advantages to any device in which power consumption is required to be kept low such as in portable devices and other battery powered devices.

In addition, the present disclosure will be described with reference to a dual mode MS which is capable of communicating with 2G and 3G communication systems. It will however be appreciated that the present disclosure may apply to other multi-mode devices or different communication systems, which may be selected from, for example: private mobile radio (PMR); the Global System for Mobile Communication (GSM); Enhanced Data rates for GSM Evolution (EDGE); General Packet Radio System (GPRS); Wideband Code Division Multiple Access (WCDMA) or Universal Mobile Telecommunications System (UMTS); Third Generation Long Term Evolution (LTE); Wireless Local Area Networks (WLAN); Worldwide Interoperability for Microwave Access (WIMAX); Bluetooth; or the like.

Figure 1:
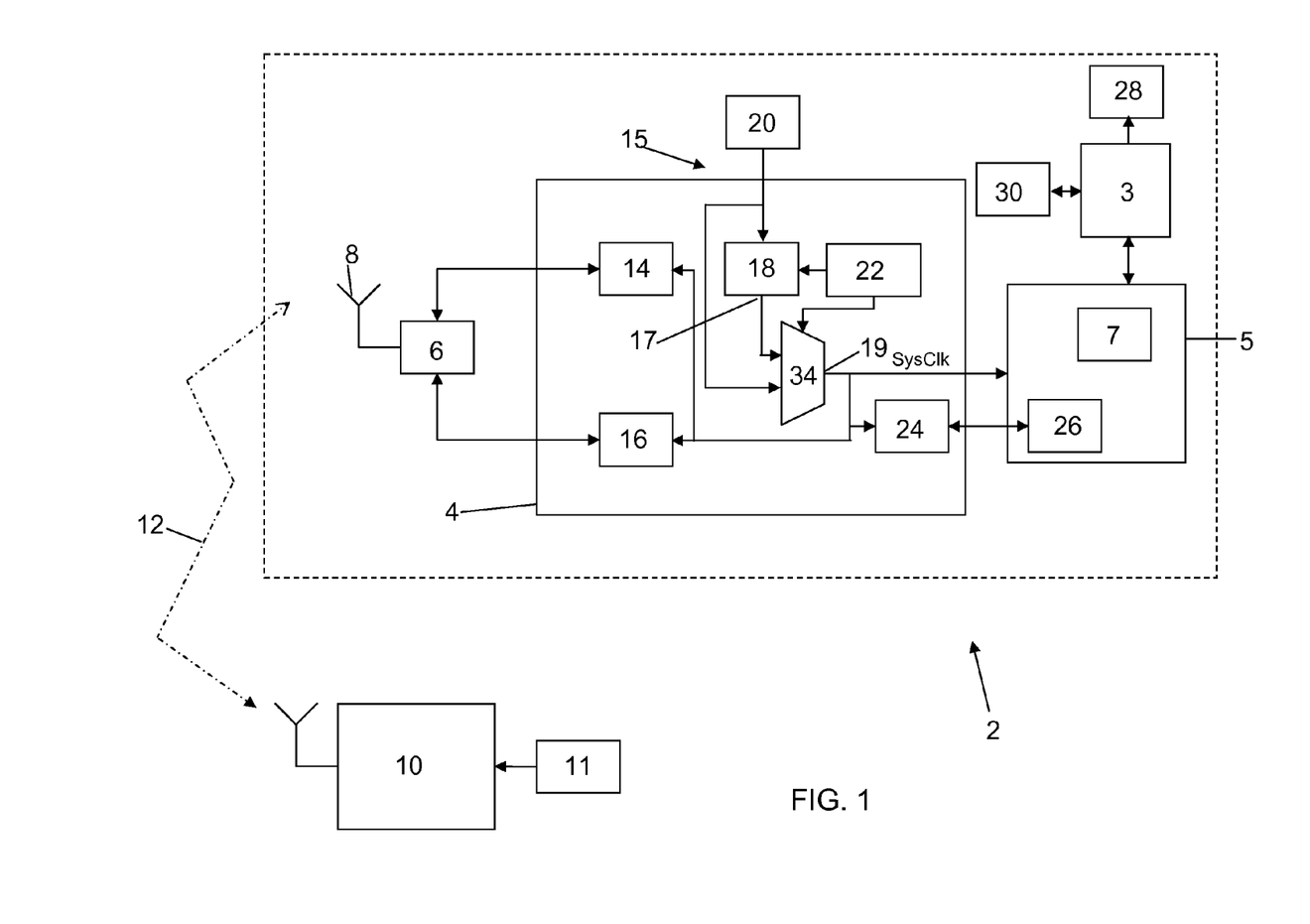
FIG. 1 is a block schematic diagram of an example of a communication device including a clock signal generating arrangement.

A diagram of the main functional components of a MS 2 in accordance with an embodiment of the disclosure is shown in FIG. 1. As will be apparent to a skilled person, only those functional components of the MS 2 that are necessary for an understanding of the disclosure have been shown and will be described.

The MS 2 comprises a processing unit 3 for carrying out operational processing for the MS. The MS 2 also comprises a RF transceiver block 4 coupled to an antenna 8 via a duplexer 6 and a baseband block 5 which processes the baseband signals received by or to be transmitted from the RF transceiver block 4. The antenna 8 provides wireless communication with a Base Station (BS) 10 over a radio communication link 12 as is well known in the art.

Since the MS 2 is a multi-mode MS capable of operating with different communication systems which may each operate on different frequencies and may additionally or alternatively operate with different protocols, in the embodiment shown in FIG. 1, the MS 2 comprises a RF transceiver block 4 which is programmable to operate with each one of the different communication systems. The RF transceiver block 4 includes a receiver 14 and transmitter 16. In an alternative arrangement not described herein, the MS 2 may include a set of separate receivers and transmitters for each communication system with which the MS has to be able to operate.

Although not shown, the RF transceiver block 4 also comprises other elements for performing RF functions as will be known to a skilled person and thus will not be described further herein. The RF transceiver block 4 further comprises an interface 24 for communicating with an interface 26 in the baseband block 3. In an embodiment, interfaces 24 and 26 implement the 3G DigRF standard and transfer data between the RF transceiver block 4 and the baseband block 5 for when the RF transceiver block 4 is active for either the 2G and 3G communication systems.

The baseband block 5 also comprises elements such as a baseband processor, a layer one timer, baseband peripheral devices etc as is well known in the art. The baseband block 5 receives a system clock signal SysClk as its timing reference from the RF receiver block 4. The baseband block 5 is coupled to and controlled by the processing unit 3 and includes a baseband processor 7 which may be a DSP such as DSP56600 supplied by Freescale Semiconductor, Inc. In other embodiments, the baseband processor 7 may be part of the processing unit 3 or the processing unit 3 may be part of the baseband block 5. The number of processors and the allocation of processing functions to the processor may be varied depending on the specific implementation.

The MS 2 also has a Man Machine Interface MMI 28, including elements such as a key pad, microphone, speaker, display screen, for providing an interface between the MS and the user of the MS. The MMI 28 is also coupled to the processing unit 3.

The MS 2 further comprises a program memory 30 in which is stored programs containing processor instructions for operation of the MS 2. The program memory 30 is shown in FIG. 1 as a separate component of the MS 2 to the processing unit 3 but may be part of the processing unit itself. The programs in the program memory 30 may contain a number of different program elements or sub-routines containing processor instructions for a variety of different tasks, for example: for exchanging signals with the base station to establish a communication, for sending or receiving speech, text, multimedia or other data, for communicating with the user via the MMI 28.

The MS 2 comprises a clock signal generating arrangement 15 for generating a system clock signal SysClk at an output 19 for use as a timing reference in the RF transceiver block 4. The clock signal generating arrangement 15 comprises a reference clock generator 20 for generating a reference clock signal and a main clock generator 18 for generating a main clock signal. The main clock signal has a greater frequency accuracy than the reference clock signal. The reference clock generator 20 may for example be a reference crystal oscillator while the main clock generator may be a PLL circuit 18 coupled to receive the reference clock signal from the reference crystal oscillator 20. The PLL circuit has an output 17 for providing a main clock signal. The operation of the PLL circuit 18 is controlled by a processor 22 which is part of the RF transceiver block. In an alternative arrangement, the functionality of the processor 22 may be replaced by hardwired logic. In order to support the 3G DigRF standard, the PLL circuit 18 is a high speed PLL circuit 18 capable of operating at, for example, 2496 MHz and providing a main clock signal at 26 MHz.

In operation when the MS 2 is powered on, the MS 2 may be operating in one of several modes, e.g. including: a 2G active mode in which the transmitter 16 and receiver 14 are active and the MS 2 is transmitting and/or receiving signals over the radio communication link 12 through the 2G communication system, a 3G active mode in which the transmitter 16 and receiver 14 are active and the MS 2 is transmitting and/or receiving signals through the 3G communication system, a 2G idle mode in which the receiver 14 and transmitter 16 are inactive between 2G active timeslots and the MS 2 is not transmitting and/or receiving signals over the radio communication link 12 through the 2G communication system and a 2G/3G idle mode in which the transmitter 16 and receiver 14 are not configured nor active for either 2G or 3G communication.

During the 2G and 3G active modes when the RF transceiver block 4 and the transmitter 16 and receiver 14 are active, the system clock signal SysClk is provided to the baseband block 5 and the receiver 14 and transmitter 16 by the main clock signal at the output 17 of the PLL circuit 18 using the reference clock signal from the reference crystal oscillator 20. As described above in the introduction, using the reference clock signal from the reference crystal oscillator 20 introduces a frequency or phase error into the system clock signal SysClk due to frequency drift of the reference crystal oscillator 20. Over time this error leads to accumulated timing offset which can interfere with the correct operation of the baseband block 5. The errors introduced through use of the reference crystal oscillator 20 to generate the system clock signal SysClk may be corrected, in order to ensure that the system clock signal SysClk is accurate and thus to ensure correct operation of the baseband block 5.

In an embodiment, the correction is performed by using signals received at the MS 2 from a BS 10 which are generated according to an accurate timing reference 11 in the BS 10. The baseband block 5 calculates the frequency error between the received signals and the reference clock signal using Automatic Frequency Correction (AFC) algorithms and the calculated AFC information, which typically includes AFC words, is provided to the processor 22 and used to control the divider (not shown) of the PLL circuit 18 to correct the main clock signal at the output 17 so that the system clock signal SysClk provided to the baseband block 5 is accurate (i.e. the error accumulated over time is substantially zero). Thus, the AFC information is available to the RF transceiver block 4 to calculate timing drift over a known period of time. It should be noted that other correction techniques may be used as well. For example, correction algorithms other than AFC can be used by the baseband block 5 to provide correction information to the RF transceiver block 4, the tuning voltage for tuning a voltage controlled crystal oscillator may be varied based on the AFC information or other correction information in order to correct for the frequency error rather than using a PLL circuit.

In the example of FIG. 1, the MS 2 is arranged such that the PLL circuit 18 is active during an active mode (between time t0 to t1 in FIG. 2) such that the cumulative error or the cumulative timing offset in the system clock signal SysClk provided by the main clock signal at the output 17 of the PLL circuit 18 due to the frequency drift of the reference crystal oscillator 20 is substantially zero by means of the corrections made by the PLL circuit 18. The MS 2 is further arranged such that the PLL circuit 18 is inactive during some or all of an idle mode (between t1 and t2 in FIG. 2) in which the RF transceiver block 4 is idle or inactive for 2G or 3G communication. The idle mode may be a 2G idle mode or a 2G/3G idle mode. Whilst the PLL circuit 18 is inactive in the idle mode, the reference clock signal from the reference crystal oscillator 20 is used as the system clock signal and provided as a timing reference to the baseband block 5 and receiver 14 and 16.

Figure 2:
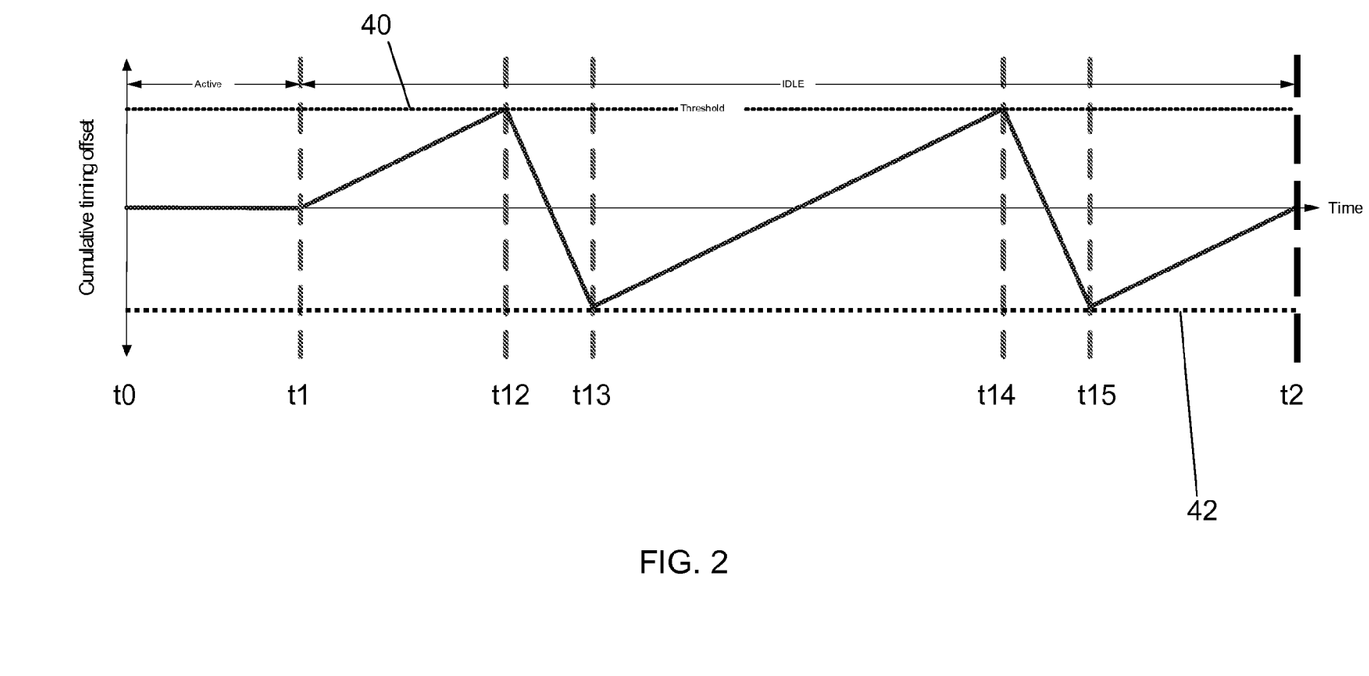
FIG. 2 is a graphical representation of the variation over time of the error in the system clock signal at the output of the example of FIG. 1 during an idle mode.

Thus, between times t1 and t12 the PLL circuit 18 is inactive, and the reference clock signal is used as the system clock signal SysClk. (In the arrangements known from the prior art, the PLL circuit 18 remains active in order to provide a corrected and accurate main clock which provides the system clock signal SysClk as a timing reference in the 2G/3G active modes, the 2G/3G idle mode and the 2G idle mode. As discussed in the introduction, by using a high speed PLL circuit 18, the power consumption of the elements which provide the 2G functionality is increased compared to the comparable elements of a single mode 2G MS.)

A clock error detector, which in an embodiment is implemented in the processor 22, keeps track of the error in the reference clock signal as it accumulates with time (as shown between t1 and t12 in FIG. 2) and detects when the error or cumulative timing offset reaches a first predetermined threshold 40 at t12 as shown in FIG. 2. The clock error detector may, for example, be implemented in the processor 22 by means of a timer (not shown) and from the AFC information provided by the baseband block 5, which indicates the error between the frequency of the reference clock signal and the frequency of the accurate timing reference 11, and which is already available to the processor 22. As indicated above, other correction information may be provided by the baseband block 5 and used by the RF transceiver block 4 to correct for frequency drift in the reference clock signal.

A clock adjust circuit is coupled to the reference crystal oscillator 20 and to the processor 22 and is arranged to compensate for the error in the reference clock signal when the detected error in the reference clock signal reaches the first predetermined threshold to provide a compensated reference clock signal until the error in the compensated reference clock signal reaches a second predetermined threshold 42 at t13. The first predetermined threshold 40 is selected according to system constraints which determine the level of error which still ensures proper operation of the baseband clock 5. For example, for a baseband block 5 requiring a 26 MHz system clock, the first predetermined threshold 40 may correspond to an error or cumulative timing offset of approximately ½ clock cycle. The second predetermined threshold 42 is selected so that the overall error or cumulative timing offset of the reference clock signal and the compensated reference clock signal is substantially zero. In FIG. 2, the error of the reference clock signal between t1 and t12 is shown to be positive which arises when the reference clock signal is 'faster' than the accurate timing reference 11 in the BS 10. In this case, the first predetermined threshold 40 is greater than the second predetermined threshold 42. It will however be appreciated that the invention applies also to when the error is negative which arises when the reference clock signal is 'slower' than the accurate timing reference 11. In this case, the first predetermined threshold 40 will be less than the second predetermined threshold 42.

In the example shown in FIG. 1, the clock adjust circuit is implemented by the PLL circuit 18 such that between t12 and t13 the PLL circuit 18 is active to compensate for the error in the reference clock signal. It should be noted that the clock adjust circuit may be implemented any other way suitable for the specific implementation. By using the PLL circuit 18 as the clock adjust circuit, the PLL circuit 18 can provide at the output 17 a compensated reference clock signal having a frequency corresponding to the frequency of the reference clock signal but which is adjusted at a controlled rate. The rate is controlled by the processor 22 which controls the frequency divider (not shown) in the PLL circuit 18. By compensating for the error at a controlled rate, the unlocking of the PLL circuit (not shown) of the baseband block 5 can be avoided. For the example given above, when the first predetermined threshold corresponds to an error or cumulative timing offset of ½ clock cycle and the reference clock signal is 'faster' than the accurate timing reference 11, the PLL circuit 18 acting as the clock adjust circuit is arranged to remove one cycle of the reference clock signal by slowly walking the phase of the reference clock signal back 360 degrees.

Figure 3:
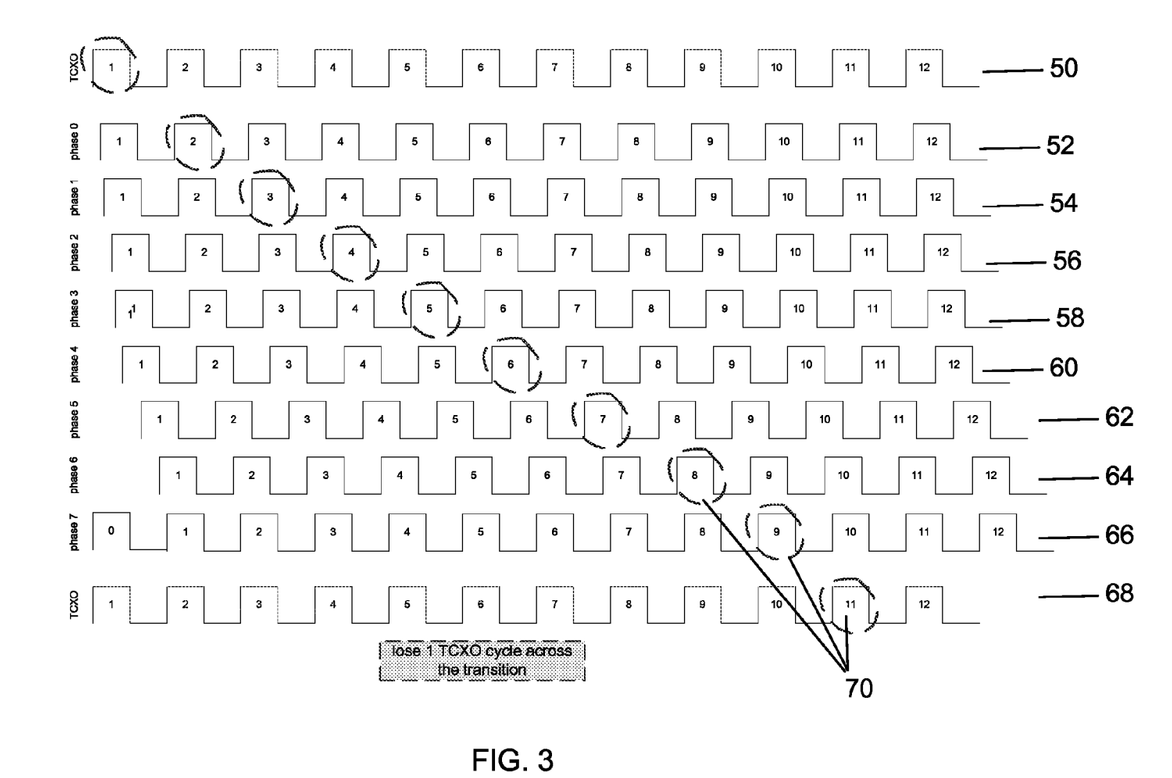
FIG. 3 is a graphical representation of a number of cycles of the reference clock signal and different phases of the compensated reference clock signal generated by the example of shown in FIG. 1 during an idle mode.

The adjustment of the reference clock signal at a controlled rate to compensate for the error in the reference clock signal by deleting one cycle is illustrated in more detail in FIG. 3. The error in the reference clock signal is compensated by generating N clock signals (in FIG. 3, N=8) at the reference clock frequency but phase shifted by a predetermined amount. In order to change the phase of the reference clock signal by 360 degrees, the PLL circuit 18 is arranged to generate N clock signals at the same frequency and with each clock signal being successively phase shifted by an equal amount of 360/N degrees. The value N is selected based on ease of implementation since the phase offsets are required to be generated in hardware (e.g. by the frequency divider of the PLL circuit 18) and for system stability so that the PLL circuit of the baseband block 5 does not lose lock. Signal 50 corresponds to the reference clock signal with accumulated timing offset. Signal 52 corresponds to the compensated reference clock signal at the output 17 of the PLL circuit 18 during phase 0 of the PLL circuit 18 after the PLL circuit 18 has first been activated when the error in the reference clock signal reaches the first predetermined threshold 40. Signal 54 corresponds to the compensated reference clock signal during phase 1 of the PLL circuit 18. Signal 56 corresponds to the compensated reference clock signal during phase 2 of the PLL circuit 18 and so on. In practice there will be a delay, for example up to 10 μs delay, between transitions from one phase to the next in order to avoid unlocking the PLL circuit of the baseband block 5.

The correction interval (e,g the time between t13 and t14) between when the reference clock signal has to be compensated or corrected (e.g. which occurs between t12 and t13 or t14 and t15 when the compensated reference clock signal is generated) will vary depending on the error inherent in the frequency of the reference crystal oscillator 20. A large error will mean that the interval is small so that the compensations can be performed more frequently whereas a small error will require the corrections or compensations to occur less frequently. The correction intervals are independent of the transmit and receiver operations during an active mode and may occur during them.

The MS 2 further comprises a clock signal selector 34 coupled to the output 17 of the PLL circuit 18 and to the reference crystal oscillator 20. The output 19 of the clock signal selector 34 provides the output of the clock signal generating arrangement 15. The clock signal selector 34 is arranged to selectively provide to the output 19 of the clock signal generating arrangement 15 as the system clock signal SysClk the compensated reference clock signal when an error in the reference clock signal reaches a first predetermined threshold and until the error in the reference clock signal reaches a second predetermined threshold and otherwise the reference clock signal when the MS 2 is operating in an idle mode or the main clock signal when the MS 2 is operating in an active mode. The clock signal selector 34 is coupled to the processor 22 and may be implemented as a multiplexer 34 under the control of the processor 22.

Figure 4:
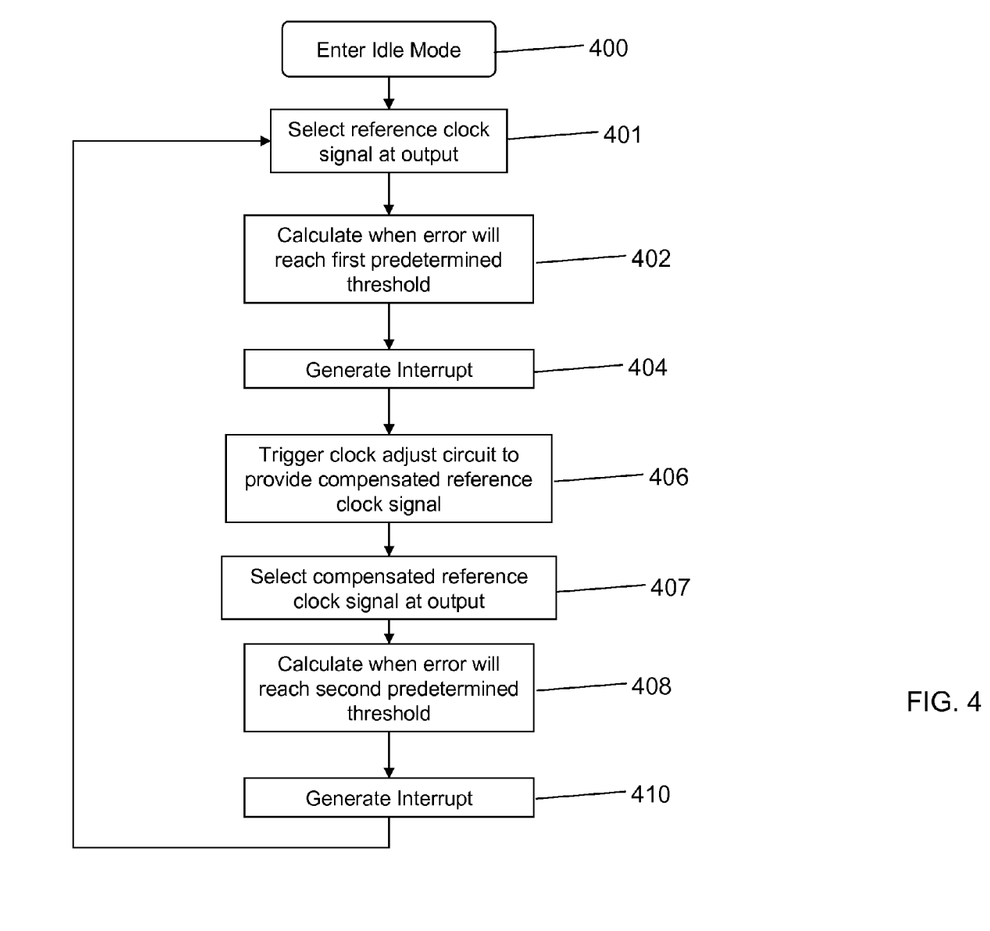
FIG. 4 is a flow diagram describing the operation of the example of FIG. 1 during an idle mode.

The operation of the clock signal generating arrangement 15 will now be described in more detail with further reference to the flow diagram in FIG. 4.

In the active mode during which the RF transceiver block 4 and the receiver 14 and transmitter 16 are active and the MS 2 is transmitting or receiving via the 2G or 3G radio interface (time t0 to t1 in FIG. 2), the PLL circuit 18 is active in order to provide an accurate main clock signal at the output 17. The processor 22 controls the clock signal selector 34 so that the main clock signal is provided at the output 19 of the clock signal generating arrangement 15 so as to provide an accurate system clock signal as the timing reference to the MS 2.

As illustrated with block 400, the MS 2 enters an idle mode (e.g. 2G or 2G/3G idle mode) during which the MS 2 is not receiving or transmitting signals via the 2G or 3G radio interface. Upon entry to the idle mode at time t1 in FIG. 2, the processor 22 disables PLL circuit 18 and the processor 22, as illustrated with block 401, starts a timer (not shown) and controls the clock signal selector 34 so that the reference clock signal is provided at the output 19 of the clock signal generating arrangement 15 so as to provide the timing reference to the MS 2 (this is signal 50 in FIG. 3). The processor 22 also uses the AFC information provided by the baseband block 5 and the timer to calculate when the accumulated timing offset or error of the reference clock signal will reach the first predetermined threshold and sets an interrupt to occur at this calculated time (t12 in FIG. 2), as illustrated with block 402. Thus, for the example discussed above, the interrupt is set for time t12 in FIG. 2 when the error in the reference clock signal reaches ½ a cycle of the reference clock signal. When the timer reaches the calculated time at t12, an interrupt is generated by the processor 22, as illustrated with block 404. The processor 22 resets the timer and triggers the clock adjust circuit to provide a compensated reference clock signal as illustrated with block 406 to compensate for error in the reference clock signal and controls the clock signal selector 34 so that the compensated reference clock signal is provided at the output 19 of the clock signal generating arrangement 15 so as to provide the timing reference to the MS 2, as illustrated with block 407. In the embodiment shown in FIG. 1, the clock adjust circuit comprises the PLL circuit 18 and thus at time t12, the processor 22 activates the PLL circuit 18 to provide the compensated reference clock signal to the clock signal selector 34. As illustrated with block 408, the processor 22 calculates, using the AFC information and the timer, when the compensated reference clock signal will have compensated for error in the reference clock signal so that the average accumulated timing offset or error in the reference clock signal over time is substantially zero and sets an interrupt to occur at this time, t13 in FIG. 2. In other words, the processor 22 calculates when the error or cumulative timing offset in the reference clock signal has reached a second predetermined threshold with the second predetermined threshold being selected so that the long term average error or cumulative timing offset of the reference clock signal is substantially zero. Thus, for the example discussed above, the interrupt is set for time t13 in FIG. 2 when the error in the reference clock signal reaches one cycle of the reference clock signal. When the timer reaches the calculated time at t13, an interrupt is generated by the processor 22, as illustrated with block 410. Provided the MS 2 is still in idle mode, the flow returns to block 401 with the processor 22 resetting the timer and controlling the clock signal selector 34 so that the reference clock signal is provided at the output 19 of the clock signal generating arrangement 15 so as to provide the timing reference to the MS 2 and calculating the time of the next interrupt at t14 when the error in the reference clock signal reaches the first predetermined threshold again, block 402. At t13, the clock adjust circuit (e.g. the PLL circuit 18) is also deactivated by the processor 22. On exiting the idle mode, the interrupts and timers are disabled.

In the example in which the clock adjust circuit comprises the PLL circuit 18, in response to the interrupt at time t12, the PLL circuit 18 is activated by the processor 22 and the processor 22 programs the appropriate value into the frequency divider (not shown) of the PLL circuit 18 to provide a compensated reference clock signal (signal 52 in FIG. 3) in phase 0 of the PLL circuit 18. The processor 22 controls the PLL circuit 18 to successively switch through the multiple phases of the reference clock signal to provide the signals 52-66 as shown in FIG. 3. The output of the clock signal selector 34 in time t12 to t13 is shown by the dotted line circles 70 in FIG. 3. Thus, as can be seen in FIG. 3, one cycle of the reference clock signal is deleted over time t12 to t13. It will be appreciated that in the case when the reference clock signal is 'slower' than the accurate timing reference 11, the PLL circuit 18 acting as the clock adjust circuit will be arranged to add one cycle (for when the first predetermined threshold is ½ cycle) to the reference clock signal by slowly walking the phase of the reference clock signal forward by 360 degrees.

Thus, since the clock signal generating arrangement 5 in accordance with the disclosure uses the reference clock signal when the MS 2 is in idle mode to provide the system clock signal rather than the main clock signal from the PLL circuit 18, the PLL circuit 18 can be deactivated during some or all of the idle mode. If the PLL circuit 18 is used to provide the compensated reference clock signal, the PLL circuit 18 can still be deactivated or disabled during a significant amount of time during the idle mode e.g. between t13 and t14 in FIG. 2. Since a high speed PLL circuit consumes significant power in a battery operated device, by deactivating or disabling the PLL circuit 18 during some or all of the idle mode, the power consumption can be reduced compared to keeping the PLL circuit 18 active throughout the idle mode. Setting the first predetermined threshold at an appropriate value and using the compensated reference clock signal means that a system clock signal is provided using the reference clock signal in the idle mode but ensures that the error in the reference clock signal is kept within limits to ensure proper operation of the baseband block 5.

By using the clock signal generating arrangement 15 in accordance with the disclosure in a RF transceiver block in a multi-mode MS, the power consumption of the RF transceiver block when operating in a 2G mode will be closer to the traditional 2G only transceiver performance. In addition, lower current consumption during idle mode means improved battery lifetime.

The first and second predetermined thresholds are programmable and thus, can be set up according to the reference crystal oscillator 20 and the operating limits of the particular application: for example, according to what error is acceptable to the baseband block 5.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

For instance, although the disclosure has been described with reference to reducing power consumption in a RF transceiver block in 2G or 2G/3G idle mode, it will be appreciated that the disclosure applies to any transceiver or receiver or transmitter in idle mode in a communication device in which the main clock generator which provides a more accurate clock signal as a timing reference and which is more power consuming can be switched off.

Also for example, the clock generating arrangement, and/or transceiver block and/or baseband block may be circuitry located on a single integrated circuit or within a same device. Alternatively, the MS may include any number of separate integrated circuits or separate devices interconnected with each other. For example, memory 30 may be located on a same integrated circuit as processor 3 or located within another peripheral or slave discretely separate from other elements. Also for example, MS 2 or portions thereof may be soft or code representations of physical circuitry or of logical representations convertible into physical circuitry. As such, MS 2 or parts thereof may be embodied in a hardware description language of any appropriate type.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A clock signal generating arrangement for a communication device for generating a system clock signal at an output for use as a timing reference, the clock signal generating arrangement comprising:
 a reference clock generator for generating a reference clock signal;
 a main clock generator for generating a main clock signal having a greater accuracy than the reference clock signal;
 a clock adjust circuit coupled to the reference clock generator for generating a compensated reference clock signal to compensate for a time accumulated error in the reference clock signal; and
 a clock signal selector coupled to the reference clock generator, the main clock generator and the clock adjust circuit, the clock signal selector to:
  when the communication device is in an idle mode of operation:

provide the reference clock signal as the system clock signal until a time accumulated error in the reference clock signal reaches a first predetermined threshold, and provide the compensated reference clock signal as the system clock signal when the first predetermined threshold is reached and until the time accumulated error in the reference clock signal reaches a second predetermined threshold; and when the communication device is operating in an active mode, provide the main clock signal as the system clock signal.

2. The clock signal generating arrangement of claim 1, wherein the main clock generator comprises a Phase Lock Loop (PLL) Circuit.

3. The clock signal generating arrangement of claim 2, wherein the PLL circuit is coupled to the reference clock generator and is arranged to generate the main clock signal using the reference clock signal.

4. The clock signal generating arrangement of claim 1, wherein the time accumulated error in the reference clock signal is a cumulative timing offset and wherein the second predetermined threshold is selected such that the compensated reference clock signal compensates for the cumulative timing offset of the reference clock signal and after a period of time, the cumulative timing offset is zero.

5. The clock signal generating arrangement of claim 1 wherein the clock adjust circuit is arranged to generate when the communication device is in the idle mode of operation the compensated reference clock signal having a same frequency as the reference clock signal and being phase shifted with respect to the reference clock signal.

6. The clock signal generating arrangement of claim 2, wherein the clock adjust circuit comprises the PLL circuit for providing the compensated reference clock signal to the output of the clock signal generating arrangement when the communication device is operating in the idle mode of operation.

7. The clock signal generating arrangement according to claim 6, wherein the PLL circuit when the communication device is operating in the idle mode is arranged to provide a plurality of clock signals each clock signal having a same frequency as the reference clock signal and being phase shifted with respect to adjacent clock signals by a predetermined value, and wherein the compensated reference clock signal comprises a cycle of each of the plurality of clock signals.

8. The clock signal generating arrangement according to claim 6, wherein the PLL circuit is arranged during the idle mode of operation to be activated when the time accumulated error in the reference clock signal reaches the first predetermined threshold so as to provide the compensated reference clock signal and until the time accumulated error in the reference clock signal reaches the second predetermined threshold, when the PLL circuit is arranged to be deactivated.

9. The clock signal generating arrangement according to claim 6, wherein the compensated reference clock signal adds or removes one clock cycle from the reference clock signal.

10. The clock signal generating arrangement of claim 1, wherein when the clock signal selector is arranged to provide the reference clock signal to the output of the clock signal generating arrangement, the main clock generator is arranged to be inactive.

11. The clock signal generating arrangement of claim 1, further comprising a processor for controlling the operation of the clock signal selector, and the clock adjust circuit.

12. The clock signal generating arrangement of claim 1, further comprising a clock error detector for detecting when the error in the reference clock signal reaches the first predetermined threshold.

13. A transceiver block for a communication device comprising:
a receiver for receiving signals;
a transmitter for transmitting signals; and
a clock signal generating arrangement of claim 1 for providing the system clock signal at the output for use as a timing reference for the receiver and the transmitter.

14. A wireless communication system including a transceiver block as claimed in claim 1 or a clock signal generating arrangement as claimed in claim 1.

15. A method for generating a system clock signal at an output of a clock signal generating arrangement for a communication, device, the system clock signal for use as a timing reference, the method comprising:
generating a reference clock signal by a reference clock generator;
when the communication device is in an active mode of operation, generating by a main clock generator a main clock signal having a greater accuracy than the reference clock signal and providing the main clock signal to the output as the system clock signal; and
when the communication device is in an idle mode of operation,
generating a compensated reference clock signal by a clock adjust circuit coupled to the reference clock generator to compensate for a time accumulated error in the reference clock signal:
when a time accumulated error in the reference clock signal reaches a first predetermined threshold, providing the compensated reference clock signal as the system clock signal, and
when the time accumulated error in the reference clock signal reaches a second threshold, providing the reference clock signal as the system clock signal.

16. The clock signal generating arrangement of claim 3, wherein the time accumulated error in the reference clock signal is a cumulative timing offset and wherein the second predetermined threshold is selected such that the compensated reference clock signal compensates for the cumulative timing offset of the reference clock signal and after a period of time, the cumulative timing offset is zero.

17. The clock signal generating arrangement of claim 3 wherein the clock adjust circuit is arranged to generate when the communication device is in the idle mode of operation the compensated reference clock signal having a same frequency as the reference clock signal and being phase shifted with respect to the reference clock signal.

18. The clock signal generating arrangement of claim 3, wherein when the clock signal selector is arranged to provide the reference clock signal to the output of the clock signal generating arrangement, the main clock generator is arranged to be inactive.

19. The clock signal generating arrangement of claim 3, further comprising a processor for controlling the operation of the clock signal selector, and the clock adjust circuit.

20. The clock signal generating arrangement of claim 2, further comprising a clock error detector for detecting when the error in the reference clock signal reaches the first predetermined threshold.

* * * * *